(12) United States Patent
Gregorius (10) Patent No.: US 6,710,603 B2
(45) Date of Patent: Mar. 23, 2004

(54) OVERLOAD PROTECTION CIRCUIT FOR LINE DRIVERS

(75) Inventor: Peter Gregorius, München (DE)

(73) Assignee: Infineon Technologies AG, Munich (DE)

( * ) Notice: Subject to any disclaimer, the term of this patent is extended or adjusted under 35 U.S.C. 154(b) by 181 days.

(21) Appl. No.: 10/090,318

(22) Filed: Mar. 4, 2002

(65) Prior Publication Data

US 2002/0149894 A1 Oct. 17, 2002

(30) Foreign Application Priority Data

Mar. 2, 2001 (DE) .......................................... 101 10 140

(51) Int. Cl.$^7$ .............................................. G01R 31/08
(52) U.S. Cl. ........................ 324/522; 324/523; 324/527
(58) Field of Search ................................. 324/522, 512, 324/523, 527, 713, 763, 765

(56) References Cited

FOREIGN PATENT DOCUMENTS

| EP | 0 397 102 B1 | 11/1990 |
|---|---|---|
| EP | 0 578 662 B1 | 1/1994 |
| EP | 0 696 105 A2 | 2/1996 |
| EP | 0 955 750 A2 | 11/1999 |

*Primary Examiner*—N. Le
*Assistant Examiner*—John Teresinski
(74) *Attorney, Agent, or Firm*—Laurence A. Greenberg; Werner H. Stemer; Gregory L. Mayback (57) ABSTRACT

A detection circuit is described which is configured, in particular, for line drivers for ascertaining the presence of an overshooting of a current flowing through a line above a predetermined value. The detection circuit has two current mirrors, in each case the input of one current mirror being connected to the output of the other current mirror. If the current feeds one current mirror, then an overshooting of the predetermined value can be ascertained on the basis of an output signal of the other current mirror.

21 Claims, 4 Drawing Sheets

OVERLOAD PROTECTION CIRCUIT FOR LINE DRIVERS

BACKGROUND OF THE INVENTION

Field of the Invention

The invention relates to circuits which safeguard circuits against overload currents. In particular, the invention relates to an overload protection circuit for line drivers.

In order that digital signals are transmitted in an uncorrupted manner from one integrated circuit to a further integrated circuit, it must be ensured that the connecting lines do not impair the signals. The influence of the connecting lines cannot be disregarded if, in the case of steep signal edges, the propagation time through the connecting lines is at least of the order of magnitude of the rise time of the circuit. A simple connecting wire between the circuits is no longer sufficient in this case. In order to avoid serious signal deformations, lines with a defined characteristic impedance are used, which are terminated with a characteristic impedance. Two insulated wires twisted together are often used for this purpose. Such lines are called twisted-pair lines. A twisted-pair line with approximately 100 turns per meter has a characteristic impedance of approximately 100 Ω. Owing to the low terminating resistance, the transmitter must supply a correspondingly high output current. In order to satisfy this requirement, line drivers are used as the transmitters or drivers.

For interference-immune signal transmission, line drivers are often configured in such a way that they feed the two wires of the twisted-pair lines with symmetrical, complementary signals. A comparator is used as a receiver. In this operating mode, the information is determined by the polarity of the differential voltage and not by the absolute value of the level. In this case, an interference pulse merely brings about a common-mode modulation, which remains ineffective owing to the difference formation in the comparator.

A known line driver has differential amplifiers. The inverting inputs of the differential amplifiers are fed by input currents. The input currents contain the information to be communicated. The input currents are identical in terms of their temporal characteristics and the magnitude of their amplitudes; they differ merely through different signs. The non-inverting inputs of the differential amplifiers are connected to a constant-voltage source. The differential amplifiers are connected up as current-voltage converters with feedback resisters. The outputs of the differential amplifiers feed the primary-side inputs of a transformer. The transformer communicates the signals to a twisted-pair line.

The line driver can be connected up to a load on the output side. The load stands as an equivalent circuit diagram for the transformer and the twisted-pair line. The load is characterized by a load resistance.

In the case of the line driver, a short circuit of the outputs with the supply voltage or earth can lead to static overload currents which, under certain circumstances, entail destruction of the line driver. In the case of an excessively small load resistance, with pulsed complementary input currents, an increased pulsed current flow through the line driver can occur.

In previous line drivers, protection against an overload and/or short circuit is essentially tackled with two different protection circuits. A first conventional protection circuit is based on a resistor connected in series between the source terminal of the driver transistor and the supply voltage. The voltage drop across the resistor is compared with a reference voltage by a read-out amplifier. The protection circuit has the disadvantage that the output dynamic range of the line driver is limited by the additional voltage drop.

Furthermore, an additional operational amplifier is required as the read-out amplifier, and must be tuned, since the offset voltage of the operational amplifier is present serially and hence additively with respect to the voltage dropped across the resistor. A further disadvantage of the protection circuit can occur with pulsed input currents. If the bandwidth of the read-out amplifier is not significantly larger than the frequency of the pulse train of the input currents that feed the line driver, a pulsed overload is not identified.

A second conventional protection circuit for line drivers provides for the output current flowing through an output transistor of the line driver to be limited by a clamping transistor. To that end, the output current is mirrored into the drain-source path of a further transistor by a current mirror. The clamping transistor is connected up in such a way that its gate voltage is a function of the mirrored output current. In the case of a gate voltage above the threshold voltage, the clamping transistor turns on and limits the gate voltage of the output transistor. As a result, the maximum output current flowing through the drain-source path of the output transistor is limited. The protection circuit has the disadvantage that its switching threshold is greatly dependent on the threshold voltage tolerances of the clamping transistor. Moreover, jitter about the changeover point leads to unreliable detection of an overload current. Furthermore, the protection circuit is subject to great dependencies on the temperature and on tolerances of the production process.

SUMMARY OF THE INVENTION

It is accordingly an object of the invention to provide an overload protection circuit for line drivers that overcomes the above-mentioned disadvantages of the prior art devices of this general type, which precisely detects the occurrence of overload currents above a predetermined detection threshold and whose detection threshold is adjustable in a simple manner. In particular, the intention is to provide a circuit for protecting line drivers against overload currents which contains the abovementioned detection circuit and which protects the line driver even against overload currents that occur in pulsed fashion and recur at short time intervals.

With the foregoing and other objects in view there is provided, in accordance with the invention, a detection circuit for ascertaining a presence of an overshooting of a current flowing through a line above a predetermined value. The detection circuit contains a first current mirror having a first input transistor, a first output transistor, an input, and an output outputting an output signal. A second current mirror is provided and has a second input transistor, a second output transistor, an input and an output outputting an output signal. The first input transistor has a first threshold voltage being greater than a saturation voltage of the second output transistor. The second input transistor has a second threshold voltage being greater than a saturation voltage of the first output transistor. The input of the first current mirror and the output of the second current mirror are connected to each other at a common first node and the common first node is present at an end of the line. The input of the second current mirror and the output of the first current mirror are connected to each other at a common second node. A first controllable current source is provided and has an output connected to the common first node and outputs a first current. A second controllable current source is provided and has an output connected to the common second node and outputs a second current. The first current and the second current have a linear relationship to one another, and the predetermined value is a function of the linear relationship of the first current and second current. An evaluation unit is coupled to the first current mirror and to the second current mirror. The evaluation unit ascertains the presence of the overshooting of the current flowing through the line above the predetermined value from an evaluation signal corresponding to the output signal of one of the first current mirror and the second current mirror.

The first and second input and output transistors may be configured either as MOS transistors or as bipolar transistors. An essential concept of the invention is that the input of the first current mirror and the output of the second current mirror have a common first node. Equally, the input of the second current mirror and the output of the first current mirror are connected to one another via the common second node. Furthermore, the first node is present at an end of the line. The first current can be coupled out at the output of the first controllable current source and the second current can be coupled out at the output of the second controllable current source. The first and second controllable current sources are integrated into the detection circuit in such a way that the first current feeds the first node and the second current feeds the second node. Both controllable current sources may be, for example, either voltage-controlled or current-controlled. Furthermore, the two controllable current sources necessitate one another, so is that the first current and the second current have a linear relationship to one another. By way of example, the two currents may be proportional to one another, i.e. the quotient of the first and second currents is always constant. The predetermined value, the overshooting of which causes an overload current to be indicated by the detection circuit, is a function of the linear relationship of the first and second currents. As a result, the predetermined value can be set by way of the first and second controllable current sources. The evaluation unit of the detection circuit uses an evaluation signal, which corresponds to an output signal of the first or second current mirror, to identify whether a current greater than the predetermined current flows through the line. The output signal of the first and of the second current mirror may be the current supplied by the first and second current mirror, respectively, or the voltage present at the output of the first and second current mirror respectively.

One advantage of the detection circuit according to the invention is that the detection threshold, the overshooting of which causes an overload current to be indicated by the detection circuit, is a function of the currents supplied by the controllable current sources. Controllable current sources can be produced with a high quality factor and the current supplied by them can be set to a very precise value. Therefore, in comparison with previous detection circuits, the predetermined value can be set simply and precisely. The predetermined value may possibly even be set by software. Furthermore, through suitable dimensioning of the first and second input and output transistors and of the first and second controllable current sources, it is possible to obtain a high bandwidth of the detection circuit, so that even momentary pulsed instances of overshooting of the predetermined current value can be ascertained. A further advantage of the detection circuit according to the invention over conventional detection circuits is its simple topology. Evaluation amplifiers in the form of complex operational amplifiers, as are used in many detection circuits in the prior art can be completely obviated. Moreover, the present detection circuit has a small dependence relative to temperature changes and tolerances of the production process. One reason for this is that the first and second current mirrors are interconnected in crossed fashion, as a result of which the temperature dependencies of the two current mirrors cancel one another out. In addition, the crossed interconnection of the two current mirrors allows the detection threshold to be provided with a hysteresis, so that jitter can be suppressed. Moreover, the crossed interconnection of the two current mirrors enables precise detection of overload currents.

The controllable current sources are advantageously configured as current mirrors. To that end, the first controllable current source has a third current mirror, which is characterized by a third output transistor and a third input transistor. The third input transistor is fed by a constant-current source. The second controllable current source contains a fourth current mirror having a fourth output transistor. The input transistor of the fourth current mirror is again the third input transistor. In this advantageous configuration of the detection circuit according to the invention, the predetermined value is a function of the current supplied by the constant-current source. The configuration of the controllable current sources as current mirrors is one possible, simple realization of the controllable current sources. In this case, the predetermined value can be established particularly simply through the dimensioning of the third and fourth current mirrors and through the current supplied by the constant-current source. The transistors of the third and fourth current mirrors may again be configured either as MOS transistors or as bipolar transistors.

In accordance with a further advantageous configuration of the invention, the second input transistor is connected to a read-out transistor to form a read-out current mirror, the second input transistor also being the input transistor of the read-out current mirror. On account of the current-mirror-like interconnection, an output signal of the read-out current mirror can be used as the evaluation signal. The output signal of the read-out current mirror may be either the output current or the output voltage of the read-out current mirror. The advantage of the configuration is the indirect measurement of the output signal of the second current mirror. As a result, the crossed-interconnected first and second current mirrors are not loaded by the evaluation unit or impaired in their functioning.

It is advantageous for a third controllable current source to feed the output of the read-out current mirror. The third controllable current source may be configured, for example, as a fifth current mirror that has a fifth output transistor and whose input transistor is the third input transistor.

As an alternative to the realization of the first and second controllable current sources as current mirrors, it may advantageously be provided that each controllable current source contains a MOS transistor whose gate potential is driven by a regulating circuit. To that end, the first controllable current source has an operational amplifier, a third output transistor that is a MOS transistor, and a constant-voltage source. A first terminal of the drain-source path of the third output transistor is connected to the first node and the gate potential of the third output transistor is driven by the operational amplifier in such a way that the voltage provided by the constant-voltage source is present at the second terminal of the drain-source path of the third output transistor. The second controllable current source contains a fourth output transistor, which is likewise a MOS transistor and whose first terminal of its drain-source path is connected to the second node. The gate terminal of the fourth output transistor is connected to the gate terminal of the third output transistor and is thus likewise driven by the operational amplifier. In this configuration, the predetermined value is determined by the voltage output by the constant-voltage source. Consequently, the configuration of the controllable current sources is voltage-controlled, in contrast to the current-controlled configuration described above.

It is advantageous that the non-inverting input of the operational amplifier may be connected to the output of the constant-voltage source and the inverting input of the operational amplifier may be connected to the second terminal of the drain-source path of the third output transistor. Furthermore, it is advantageous if the output of the operational amplifier is connected to the gate terminals of the third and fourth output transistors. The essential advantage of the voltage-controlled configuration of the first and second controllable current sources is that the accuracy and the synchronism of the first and second currents supplied by the controllable current sources are very high. In this respect, the configuration according to the invention even surpasses the current-controlled configuration described above.

In the case of the voltage-controlled realization of the controllable current sources, in the same way as in the case of the current-controlled realization, it may advantageously be provided that the second input transistor is connected to a read-out transistor to form a read-out current mirror, the second input transistor also being the input transistor of the read-out current mirror. On account of the current-mirror-like interconnection, an output signal of the read-out current mirror can again be used as the evaluation signal. The advantage of the configuration again resides in the indirect measurement of the output signal of the second current mirror. As a result, the crossed-interconnected first and second current mirrors are not loaded by the evaluation unit or impaired in their functioning.

A further advantageous configuration of the invention provides for the first and second input and output transistors and also the read-out transistor to have the same conductivity type and to be, in particular n-channel MOSFETs. The use of transistors with the same conductivity type for the crossed-interconnected current mirrors increases the accuracy of the detection threshold of the detection circuit and makes the detection circuit less dependent relative to tolerances of its production process. Furthermore, the use of MOS transistors has the advantage that the current flowing through their drain-source paths can be precisely interrupted by suitable choice of the gate potential. On account of the function of the first and second input and output transistors, this ensures a precise detection of overload currents by the detection circuit according to the invention.

A protection circuit according to the invention, whose task is to limit a signal potential present on a signal line below a predetermined signal potential value, contains a converter circuit, a detection circuit and a protection device. The converter circuit serves for converting the signal potential into a corresponding signal current. By use of the detection circuit, it is possible to ascertain whether a current flowing through a line exceeds a predetermined value. In this case, the current corresponds to the signal current. The detection circuit can have the same features as the detection circuit described above. The protection device serves for limiting the signal potential below the predetermined signal potential value, if an overshooting of the current flowing through the line above the predetermined value is indicated by the detection circuit. The overshooting of the current flowing through the line above the predetermined value corresponds to an overshooting of the signal potential above the predetermined signal potential value.

The protection circuit according to the invention can also be configured in such a way that it limits a signal current flowing through a signal line below a predetermined signal current value. It then has the same features as the above-described protection circuit for limiting the signal potential present on the signal line, except for the fact that the converter circuit is omitted. The converter circuit can be obviated since a signal current is already involved in this configuration.

It is advantageous that the protection device of the protection circuit for limiting a signal current flowing through a signal line have a MOS transistor through whose drain-source path the signal line leads. Furthermore, the protection device contains a clamping transistor that controls the gate potential of the MOS transistor. In the event of an overshooting of the current flowing through the line above the predetermined value, the clamping transistor limits the signal current below the predetermined signal current value. It may also be provided that the clamping transistor in this case completely turns off the MOS transistor for the signal current.

Since the protection circuit according to the invention contains the above-described detection circuit according to the invention, the protection circuit has the same advantages over conventional protection circuits as the detection circuit.

A line driver configuration according to the invention contains a differential line driver and four protection circuits, whose features in each case correspond to the protection circuit described above. The line driver configuration has a differential signal input with a first and second input terminal and a differential signal output with a first and a second output terminal. The signal input and the signal output of the line driver configuration are simultaneously the signal input and the signal output, respectively, of the line driver. A load can be connected between the output terminals. A signal is transmitted to the load by the line driver. Furthermore, the line driver contains a first MOS transistor, through whose drain-source path a first signal line leads, through which a first signal current flows. Analogously, the line driver has a second, third and fourth MOS transistor, through whose drain-source path a second, third and fourth signal line, respectively, leads, through which a second, third and fourth signal current, respectively, flows. The first and second signal currents feed the first output terminal, and the third and fourth signal currents feed the second output terminal of the line driver configuration. Each of the four protection circuits limits one of the four signal currents below the predetermined signal current value. In this case, each of the four MOS transistors of the line driver configuration is identical to a MOS transistor of the protection device of the four protection circuits.

The line driver configuration according to the invention contains the above-described protection circuit according to the invention. The line driver configuration thus has the same advantageous over conventional line driver configurations and line drivers as the protection circuit.

In accordance with one advantageous configuration of the line driver configuration according to the invention, in the event of an overshooting of one of the four signal currents above the predetermined signal current value, all four signal currents are limited by the protection circuits. This prevents the situation in which, in the event of the overshooting of only one signal current and the subsequent limiting of the signal current, the overload current flows away via other signal lines.

A further advantageous configuration of the line driver configuration according to the invention provides for the line driver configuration to have a counter, which may be, in particular, a digital counter. The counter counts successive instances of overshooting of the signal currents above the predetermined signal current value and limits the signal currents if the number of instances of overshooting within a predetermined period of time exceeds a predetermined number. This configuration makes it possible to detect and limit overload currents that occur in pulsed fashion and recur at short time intervals. This prevents impairment or even destruction of the line driver configuration in the event of an excessively small resistive load. Furthermore, this configuration prevents the line driver from being inhibited in the event of a pulsed overshooting of the signal current that occurs once. Such a one-off pulsed overshooting need not necessarily be caused by an excessively small resistive load, but rather may have other reasons. In order to maintain the function of the line driver in the case of such an event, the counter acts as a filter that limits the signal currents only after a predetermined number of instances of overshooting within a predetermined period of time.

Other features which are considered as characteristic for the invention are set forth in the appended claims.

Although the invention is illustrated and described herein as embodied in an overload protection circuit for line drivers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
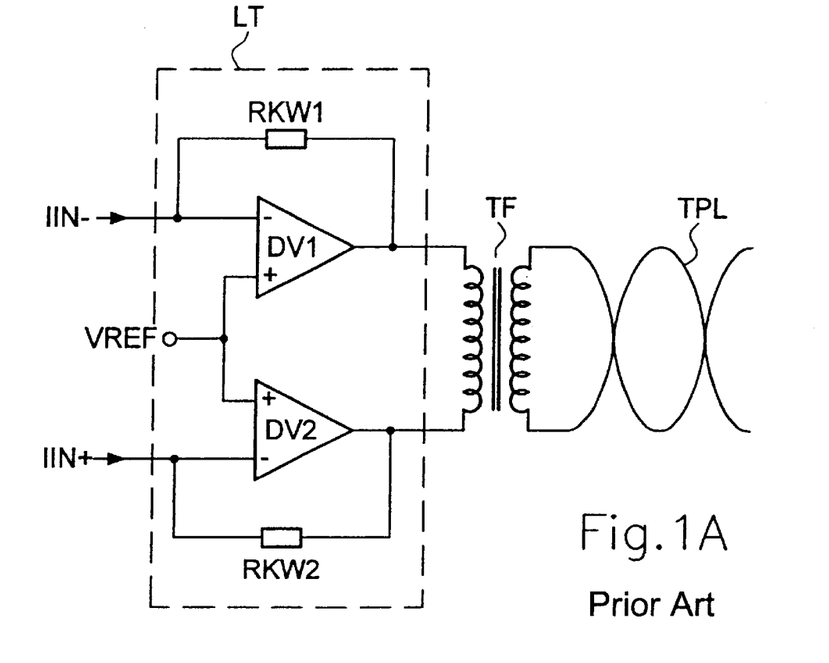
FIG. 1A is a circuit diagram of a line driver according to the prior art, which feeds a twisted-pair line.

Referring now to the figures of the drawing in detail and first, particularly, to FIG. 1a thereof, there is shown a pseudo-differential line driver LT. The line driver LT has differential amplifiers DV1 and DV2. Inverting inputs of the differential amplifiers DV1 and DV1 are fed by input currents IIN− and IIN+, respectively. The input currents IIN− and IIN+ contain the information to be communicated. The input currents IIN− and IIN+ are identical in terms of their temporal characteristics and the magnitude of their amplitudes; they differ merely by having different signs. The non-inverting inputs of the differential amplifiers DV1 and DV2 are connected to a constant-voltage source VREF. The differential amplifiers DV1 and DV2 are connected up as current-voltage converters with feedback resisters RKW1 and RKW2. Outputs of the differential amplifiers DV1 and DV2 feed primary-side inputs of a transformer TF. The transformer TF communicates the signals to a twisted-pair line TPL.

Figure 1B:
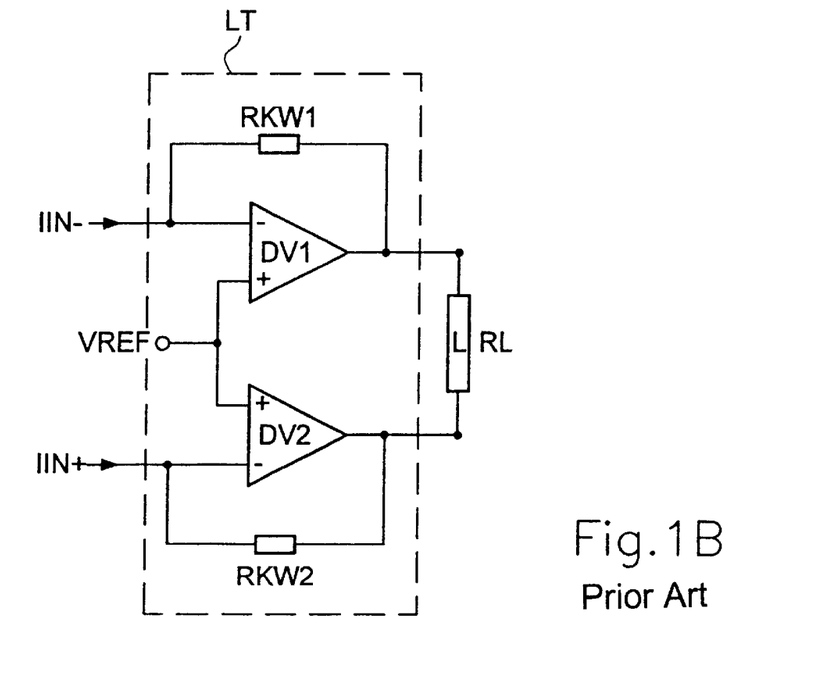
FIG. 1B is a circuit diagram of the line driver according to the prior art, which is connected up to a load on the output side.

FIG. 1B illustrates the line driver LT which is connected up to a load L on the output side. The load L stands as an equivalent circuit diagram for the transformer TF and the twisted-pair line TPL from FIG. 1A. The load L is characterized by a load resistance RL.

In the case of the line driver LT shown in FIG. 1A and FIG. 1B, a short circuit of the outputs with the supply voltage or earth can lead to static overload currents which, under certain circumstances, entail destruction of the line driver LT. In the case of an excessively small load resistance RL, with pulsed complementary input currents IIN− and IIN+, an increased pulsed current flow through the line driver LT can occur.

Figure 2:
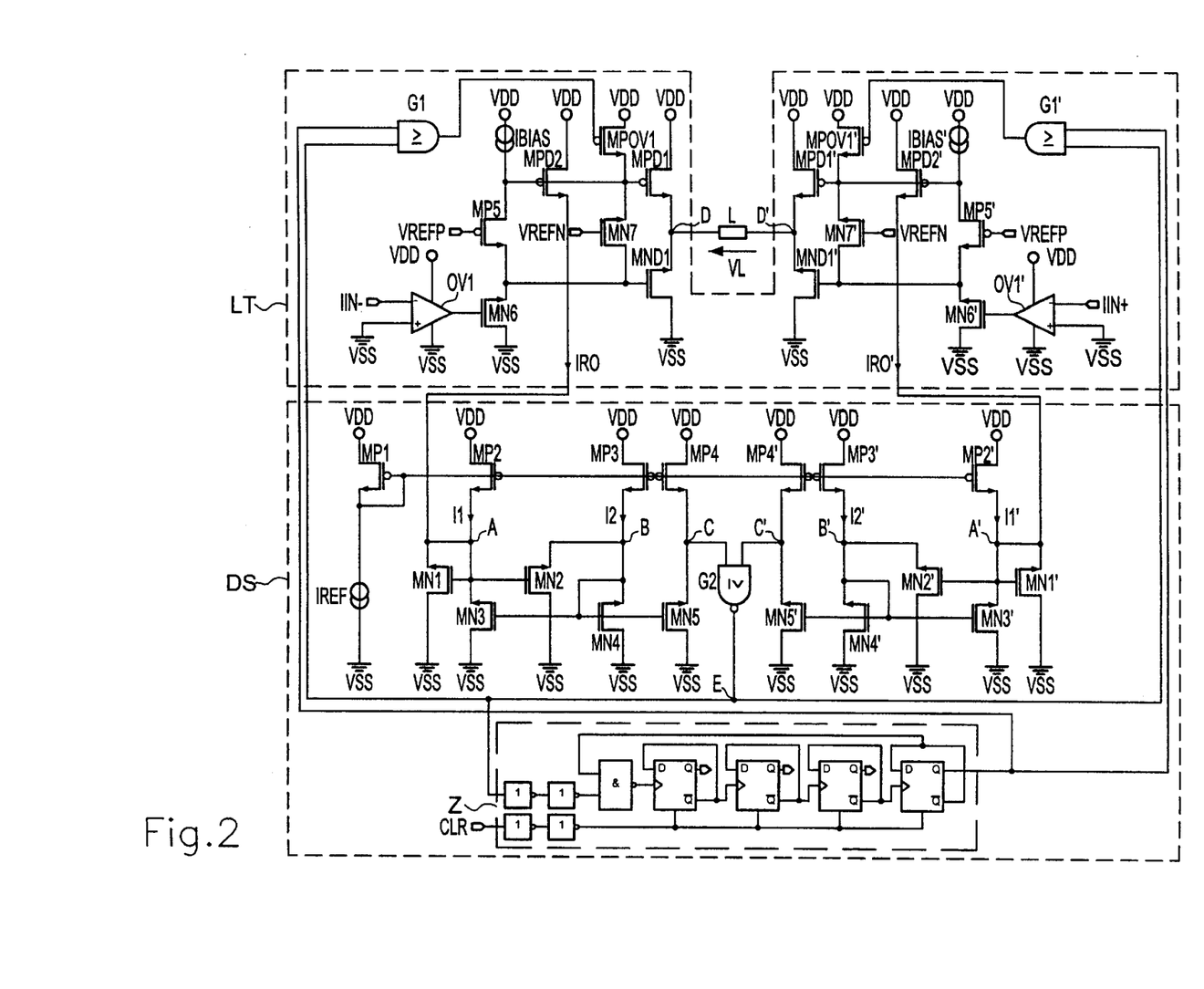
FIG. 2 is a circuit diagram of a first exemplary embodiment of the line driver configuration according to the invention.

FIG. 2 shows the circuit diagram of the differential line driver LT, which is connected to a detection circuit DS according to the invention. The detection circuit DS serves for detecting possible overload currents which flow through nodes D and D' of the line driver LT. For reasons of simplification and clarity, only one line in each case, which feeds the node D or D', respectively, of the line driver LT, is protected against overload currents in the present circuit diagram. Furthermore, the behavior of the left-hand half of the circuit is considered for the functional explanation. Since the symmetry of the circuit is obvious, the functional description also applies correspondingly to the right-hand half of the circuit. Furthermore, the designation MNx or MPx (where x=1, . . . , 7) below denotes n-channel MOSFETs or p-channel MOSFETs, respectively.

The line drive LT contains a drive configuration formed from operational amplifiers OV1 and OV1' and also transistors MP5, MN6, MN7, MP5', MN6' and MN7'. The complementary input current IIN− and IIN+ feeds the inverting input of the operational amplifier OV1 and OV1', respectively. The non-inverting inputs of the operational amplifiers OV1 and OV1' are coupled to a common, fixed potential, which may be, in particular, earth VSS. A reference voltage VREFP and VREFN is applied to gate electrodes of the transistors MP5 and MP5', and MN7 and MN7', respectively. A constant-current source IBIAS and IBIAS' sets an operating point of the transistor MN6 and MN6' respectively. Transistors MPD1, MND1, MPD1' and MND1' act as a complementary output stage of the line driver LT. Drain-source paths of the transistors MPD1 and MND1 are connected via the node D. Equally, the drain-source paths of the transistors MPD1' and MND1' are coupled to one another via the node D'. The transistors MP5 and MN7, and MP5' and MN7', set a gate potential of the transistors MPD1 and MND1, and MPD1' and MND1', respectively, via their gate-source junctions. This determines a shunt current in the output stage in the quiescent case. The complementary output stage transmits signals to the load L which is connected between the nodes D and D' and across which a voltage VL is dropped. Transistors MPOV1 and MPOV1' serve as clamping transistors which protect the transistors MPD1 and MPD1' against overload currents possibly flowing through the drain-source paths of the transistors MPD1 and MPD1'. In the case of an overload current occurring, the transistors MPOV1 and MPOV1' apply a suitable voltage to the gate electrodes of the transistors MPD1 and MPD1', so that the current flow through the drain-source paths of the transistors MPD1 and MPD1' is reduced or inhibited. In order to be able to detect such an overload current, the currents flowing through the drain-source paths of the transistors MPD1 and MPD1' must be passed out from the line driver LT in a suitable manner. This task is performed by transistors MPD2 and MPD2'. The gate electrodes of the transistors MPD2 and MPD2' are connected to the gate electrodes of the transistors MPD1 and MPD1', respectively. The drain-source paths of the transistors MPD2 and MPD2' are in each case connected up in such a way that currents IRO and IRO', respectively, flowing through them correspond to the currents flowing through the transistors MPD1 and MPD1', respectively. The currents IRO and IRO' are passed out from the line driver LT and feed inputs of the detection circuit DS. In order to increase the precision, the drain-source voltage of the transistors MPD1 and MPD1' can be replicated onto the drain-source path of the transistors MPD2 and MPD2', respectively, by a simple voltage follower. This guarantees synchronism of the transistors MPD1 and MPD2, and MPD1' and MPD2', by way of the modulation at all operating points.

Two crossed-interconnected current mirrors are the heart of the detection circuit DS. The first current mirror contains transistors MN1 and MN2, whose gate electrodes are at the same potential. A drain terminal of the transistor MN1 is connected to a gate terminal of the transistor MN1 via a node A. The current IRO feeds the drain terminal of the transistor MN1 as input of the first current mirror. The second current mirror contains transistors MN3 and MN4, a drain terminal of the transistor MN4 forming an input of the second current mirror. The drain terminal of the transistor MN4 is coupled to gate terminals of the transistors MN3 and MN4. The drain terminal of the transistor MN3 is connected, as an output of the second current mirror, to the input of the first current mirror via the node A. Equally, the drain terminal of the transistor MN2 is connected, as an output of the first current mirror, to the drain terminal of the transistor MN4 via a node B. Furthermore, the transistor MN4 is connected to a transistor MN5 in a current mirror circuit. To that end, the gate terminal of the transistor MN4 has a connection to the gate terminal of the transistor MN5. A drain terminal of the transistor MN5 forms a node C. The source terminals of the transistors MN1, MN2, MN3, MN4 and MN5 are coupled to the earth VSS.

The nodes A, B and C are fed by transistors MP2, MP3 and MP4, respectively, via the drain terminals thereof. To that end, the transistors MP2, MP3, and MP4 are configured as a current bank. An input current of the current bank is made available by a constant-current source IREF. The constant-current source IREF feeds a transistor MP1 via the drain terminal thereof. The transistor MP1 is an input transistor of the current bank. To that end, its drain terminal is connected to its gate terminal and to the gate terminals of the transistors MP2, MP3 and MP4. The source terminals of the transistors MP1, MP2, MP3 and MP4 are coupled to a supply voltage VDD.

The node C feeds an input of a gate G2. The gate G2 is an inverting OR gate. A second input of the gate G2 is fed by a node C', which is the output of the right-hand half of the detection circuit DS. On the output side, the gate G2 is connected to a digital counter Z via a node E. The counter Z has a further input CLR, to which a signal for resetting the counter Z can be applied. An output signal of the counter Z and the output signal of the gate G2 are present at the inputs of a gate G1. The gate G1 is an OR gate. The output of the gate G1 determines the gate voltage of the transistor MPOV1.

The method of operation of the detection circuit DS is described below. If the current through the load L rises in the event of positive modulation of the node D, then the current through the transistor MPD1 increases, as does the current IRO through the transistor MPD2. If the current through the transistor MPD1 is below the detection and switching threshold for overload detection, the transistor MPOV1 is turned off. In this case, a current I2 flows into the transistor MN4. The current I2 is mirrored into the node A in accordance with the translation ratio of the transistors MN3 and MN4 of the second current mirror. The voltage at the node A approximately corresponds to the saturation voltage of the transistor MN3. The drain-source voltage of the transistor MN3 lies below the threshold voltage of the transistor MN1. Consequently, no current can flow through the transistor MN1 and the first current mirror formed from the transistors MN1 and MN2 is inactive. Analogously to the node A, at the node C a voltage is established which approximately corresponds to the saturation voltage of the transistor MN5. On the output side, the gate G2 supplies a high signal, which is approximately equal to the supply voltage VDD. Thus, no voltage is dropped between gate and source of the transistor MPOV1, as a result of which the transistor MPOV1 is turned off.

If the current through the transistor MPD1 rises, then the current IRO likewise rises. If the current IRO reaches an upper switching threshold ITHP, given by the ratio I2/I1, the potential at the node A rises until the threshold voltage of the transistor MN1 is reached. The current IRO is then discharged to earth VSS through the transistor MN1. Furthermore, the current IRO is mirrored to the transistor MN2 and feeds the node B. The voltage at the node B is lowered to the saturation voltage of the transistor MN2 by the additional parallel transconductance of the transistor MN2 with respect to the transistor MN4. The voltage lies below the threshold voltage of the transistor MN4. As a result, no current flows through the transistors MN4, MN5 and MN3. The transistors MN1 and MN2 are in the saturation region. The potential at the node C is then pulled to a potential close to the supply voltage VDD by the larger transconductance of the transistor MP4. The output of the gate G2 supplies a low signal, the transistor MPOV1 correspondingly turns on and limits the gate-source voltage of the transistor MPD1 and hence the current through the transistor MPD1.

As a result of a suitable voltage being applied to the gate electrode of the transistor MPD1 by the transistor MPOV1, the current through the transistor MPD1 decreases. As a result, the current IRO is correspondingly reduced. As the current IRO decreases further, the current which is mirrored into the node B by the transistor MN2 decreases further until, as a result of the transconductance of the transistors MP3, the voltage at the node B reaches the threshold voltage of the transistor MN4. As a result, the current through the transistor MN4 rises and is mirrored into the nodes A and C by the transistors MN3 and MN5. If the current IRO falls below the lower switching threshold ITHN, then the voltage at the node A falls to approximately the saturation voltage of the transistor MN3 and, consequently, below the threshold voltage of the transistor MN1. No current then flows through the transistors MN1 and MN2. The voltage at the node 6 likewise falls to approximately the saturation voltage of the transistor MN5. The gate G2 switches to a high signal on the output side. This cancels the inhibiting of the transistor MPD1, since there is no longer an overload situation.

In the event of a very rapid pulse train with an overload occurring through the transistor MPD1, a corresponding pulse train arises on the output side of the gate G2. In order that the detection circuit DS can identify an overload in the dynamic range, the pulse train is evaluated by the counter Z. Only if a certain number of overload pulses is exceeded within a specific time interval is the output of the counter Z switched to low. The signal output at the output is forwarded to an input of the gate G1. The digital counter circuit makes it possible to turn off the transistor MPD1 in the event of short, periodically occurring overload pulses. However, provision may also be made for additionally evaluating the output signal of the gate G2 digitally.

Figure 3:
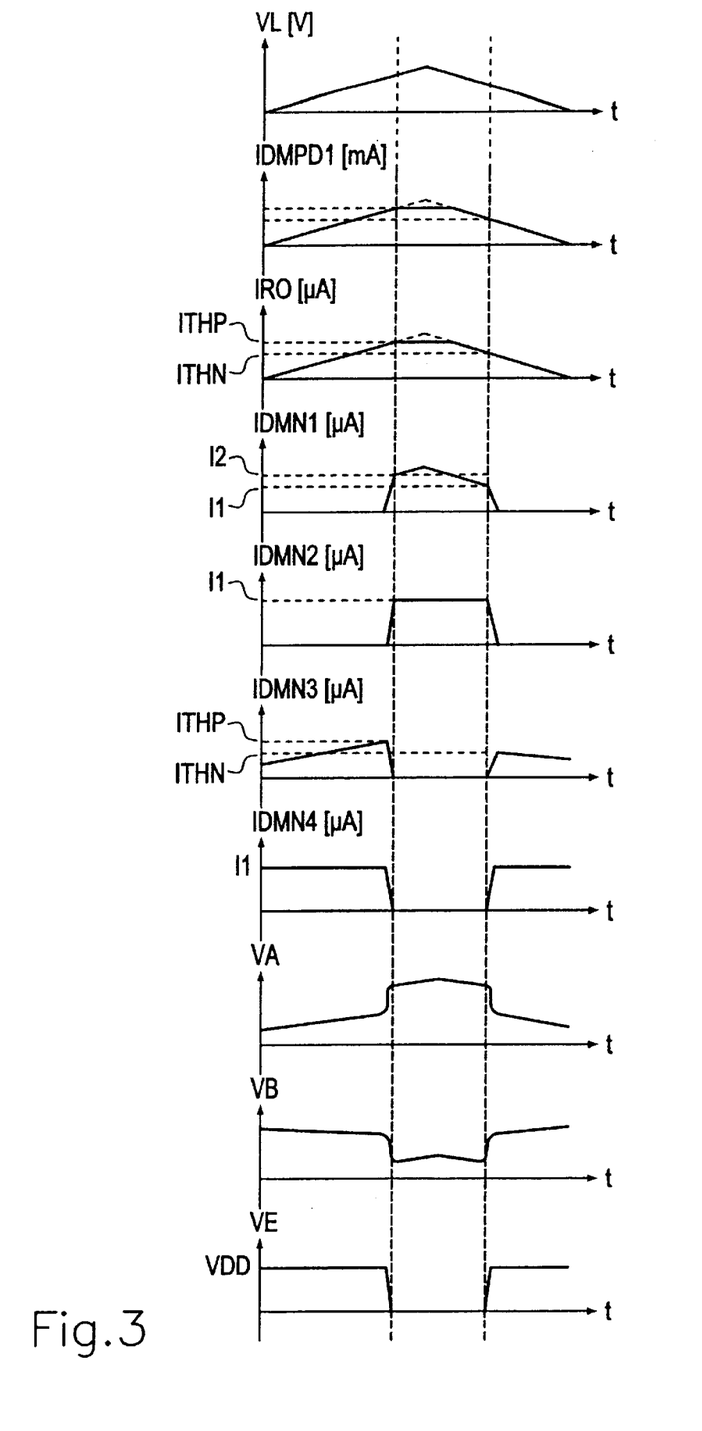
FIG. 3 is a graph showing voltage and current profiles for illustrating the method of operation of the first exemplary embodiment of the line driver configuration according to the invention.

In order to illustrate the interaction of the line driver LT with the detection circuit DS, FIG. 3 shows a number of temporal voltage and current profiles, as occur in an overload situation. IDMPD1, IDMN1, IDMN2, IDMN3 and IDMN4 denote the drain currents flowing through the transistors MPD1, MN1, MN2, MN3 and MN4, respectively, t designates a time axis, and VA, VB and VE indicate the voltages present at the nodes A, B and E, respectively.

An analytical consideration is presented below, which can be used to establish the upper and lower switching thresholds ITHP and ITHN. For simplification, it is assumed that, given identical n-channel MOSFETS and good matching in the layout, variations in the threshold voltage and in general offset can be disregarded. The upper switching threshold ITHP and the lower switching threshold ITHN result from equations (1) and (2), where $W_x$ and $L_x$ indicate a width and a length, respectively, of the gate electrode of the relevant transistor x, and $I_{DX}$ denotes the drain current through the relevant transistor x. The relevant transistor x is hereinafter always indicated in the index of the size.

$$ITHP = I_{DMN3} \approx \left(\frac{W_{MN3} * L_{MN4}}{W_{MN4} * L_{MN3}}\right) * I2 - I1 \tag{1}$$

$$ITHN = I_{DMN2} \approx \left(\frac{W_{MN1} * L_{MN2}}{W_{MN2} * L_{MN1}}\right) * I2 - I1 \tag{2}$$

The hysteresis IHYS results from the following equation:

$$IHYS = ITHP - ITHN = \left[\left(\frac{W_{MN3} * L_{MN4}}{W_{MN4} * L_{MN3}}\right) * I2 - I1\right] - \tag{3}$$
$$\left[\left(\frac{W_{MN1} * L_{MN2}}{W_{MN2} * L_{MN1}}\right) * I2 - I1\right]$$
$$= \left[\left(\frac{W_{MN1} * L_{MN2}}{W_{MN2} * L_{MN1}}\right) - \left(\frac{W_{MN3} * L_{MN4}}{W_{MN4} * L_{MN3}}\right)\right] * I2$$

The current IRO results to a first approximation from equation (4):

$$IRO = I_{DMPD1} * \frac{W_{MPD2} * L_{MPD1}}{W_{MPD1} * L_{MPD2}} \tag{4}$$

In order to configure the detection circuit DS in such a way that fast pulses can be identified, the bandwidth of the detection circuit DS must be larger than the signal bandwidth of the output pulses of the line driver LT. The internal propagation time from the occurrence of the overload current until the switching of the gate G2 should be less than half the period duration of an individual pulse. The dominant pole points of the detection circuit DS are formed at the nodes A and B. The pole frequencies are determined by the transconductance and the capacitive load at the nodes A and B. The frequencies $\omega_{pA}$ and $\omega_{pB}$ of the poles at the nodes A and B, respectively, can be described as follows:

$$\omega_{pA} \approx \frac{gm_{MN1}}{2*\pi*CnA}; CnA = C_{gsMN1} + C_{gsMN2} + C_{dsMN1} + C_{dsMN3} \tag{5}$$

$$\omega_{pB} \approx \frac{gm_{MN4}}{2*\pi*CnB}; CnB = C_{gsMN4} + C_{gsMN3} + C_{dsMN4} + C_{dsMN2} \tag{6}$$

In this case, $gm_x$ denotes the transconductance of the relevant transistor x. $C_{gsx}$ and $C_{dsx}$ indicate the gate-source and drain-source capacitances, respectively, of the relevant transistor x. The dominant poles are determined by the transconductance of the respective transistor and the gate-source and drain-source capacitances at the nodes A and B. The transconductances of the transistors MN1 and MN4 result from the following equations:

$$gm_{MN1} = 2 * \sqrt{Kp * \frac{W_{MN1}}{L_{MN1}} * IRO} \tag{7}$$

$$gm_{MN4} = 2 * \sqrt{Kp * \frac{W_{MN4}}{L_{MN4}} * I2} \tag{8}$$

where Kp is a process parameter. The dimensioning specification for the dynamic response can be derived from equations (5) to (8), where TSIG denotes the period duration:

$$\frac{T_{SIG}}{4} = \omega pA = \omega pB \tag{9}$$

$$gm_{MN1} = \frac{T_{SIG} * \pi * C_{nA}}{2} = 2 * \sqrt{Kp * \frac{W_{MN1}}{L_{MN1}} * IRO} \tag{10}$$

$$gm_{MN4} = \frac{T_{SIG} * \pi * C_{nB}}{2} = 2 * \sqrt{Kp * \frac{W_{MN4}}{L_{MN4}} * I2} \tag{11}$$

The circuit can be dimensioned using equations (1) to (11).

Figure 4:
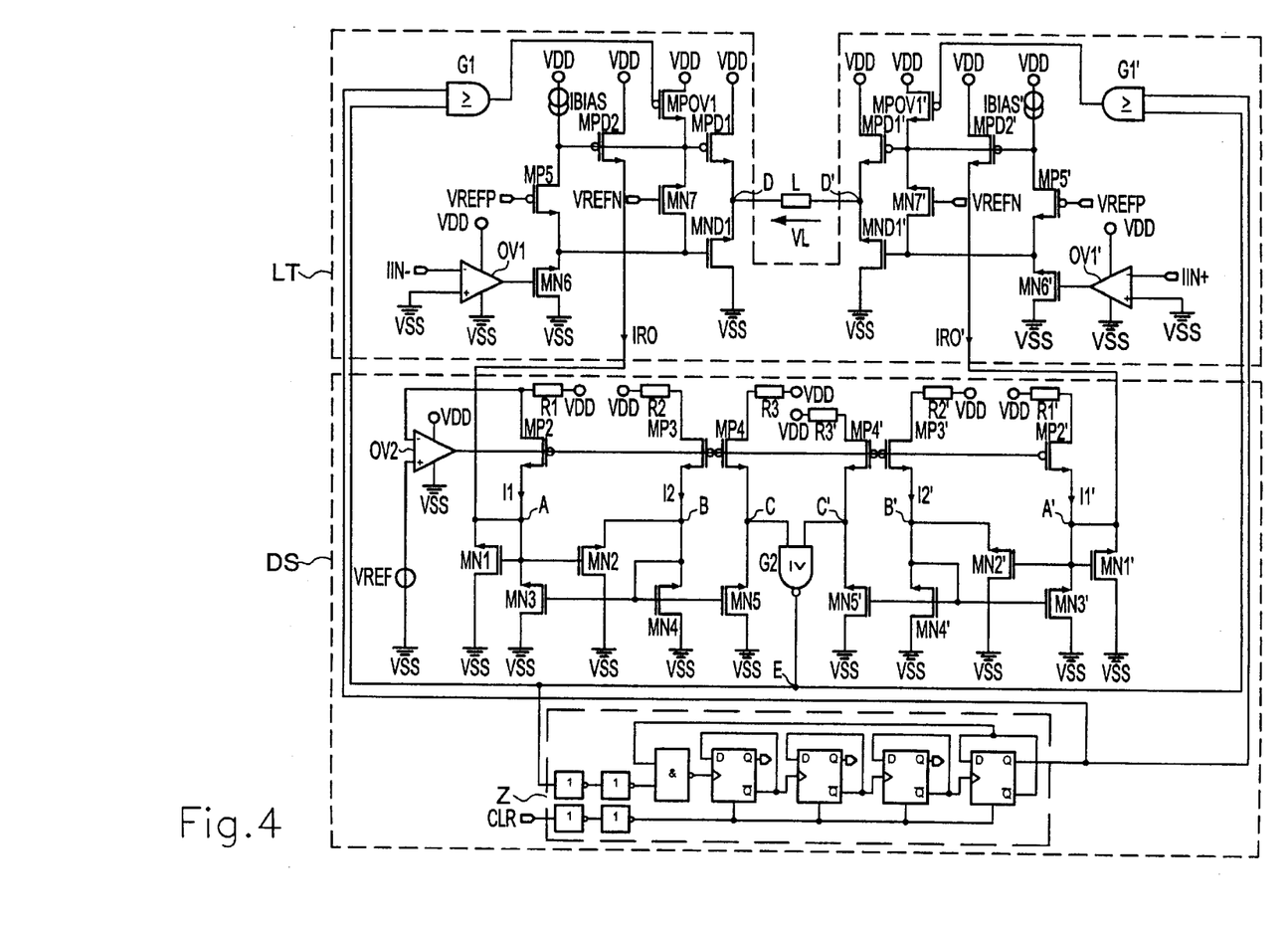
FIG. 4 is a circuit diagram of a second exemplary embodiment of the line driver configuration according to the invention.

FIG. 4 shows a second exemplary embodiment of the line driver configuration according to the invention. This exemplary embodiment is essentially identical to the line driver configuration shown in FIG. 2. However, it differs in the circuit section which generates the currents I1 and I2. Instead of the transistor MP1 an operational amplifier OV2 is provided here. A reference voltage VREF provided by a constant-voltage source VREF is applied to the non-inverting input of the operational amplifier OV2. The inverting input of the operational amplifier OV2 is connected to the source terminal of the transistor MP2 and the output of the operational amplifier OV2 controls the gate potentials of the transistors MP2, MP3, MP4, MP2', MP3' and MP4'. Furthermore, a resistor R1, R2, R3, R1', R2' and R3' is connected between the source terminal of the transistor MP2, MP3, MP4, MP2', MP3' and MP4', respectively, and the supply voltage VDD. This circuit construction regulates the voltage present at the source terminal of the transistor MP2 to the reference voltage VREF. Consequently, in the ideal case, the current I1 results from the quotient of the reference voltage VREF and the resistor R1. If the voltage dropped across the resistor R1 changes, then the operational amplifier OV2 regulates the gate potential of the transistor MP2 until the reference voltage VREF is present again at the source terminal thereof.

In comparison with the first exemplary embodiment of the invention, in the present second exemplary embodiment, a possibly occurring error caused by different potentials at the drain terminals of the transistors MP2, MP3 and MP4 is minimized.

The following equation can be given as a simple dimensioning specification for the currents I1 and I2:

$$\frac{I2}{I1} = \frac{\beta_{MP2} * \frac{W_{MP2}}{L_{MP2}} * \frac{VREF}{R1}}{\beta_{MP3} * \frac{W_{MP3}}{L_{MP3}} * \frac{VREF}{R2}} \quad (12)$$

Equation (12) obtains its validity from the fact that the transistors MP2 and MP3 are connected via their gate terminals and are thus driven in the same sense by the operational amplifier OV2.

As further alternatives to the first and second exemplary embodiments of the invention, further current mirror circuits can be used for providing the currents I1 and I2. In this case, it is possible to use, for example, cascoded transistors for other actively regulated cascodes.

I claim:

1. A detection circuit for ascertaining a presence of an overshooting of a current flowing through a line above a predetermined value, comprising:
   a first current mirror having a first input transistor, a first output transistor, an input, and an output outputting an output signal;
   a second current mirror having a second input transistor, a second output transistor, an input and an output outputting an output signal, said first input transistor having a first threshold voltage being greater than a saturation voltage of said second output transistor, said second input transistor having a second threshold voltage being greater than a saturation voltage of said first output transistor, said input of said first current mirror and said output of said second current mirror being connected to each other at a common first node and said common first node is present at an end of the line, said input of said second current mirror and said output of said first current mirror being connected to each other at a common second node;
   a first controllable current source having an output connected to said common first node and outputting a first current;
   a second controllable current source having an output connected to said common second node and outputting a second current, the first current and the second current have a linear relationship to one another, and the predetermined value is a function of the linear relationship of the first current and second current; and
   an evaluation unit coupled to said first current mirror and to said second current mirror, said evaluation unit ascertains the presence of the overshooting of the current flowing through the line above the predetermined value from an evaluation signal corresponding to the output signal of one of said first current mirror and said second current mirror.

2. The detection circuit according to claim 1, further comprising a constant-current source, said first controllable current source includes a third current mirror containing a third output transistor and a third input transistor connected to and fed by said constant-current source, said second controllable current source having a fourth current mirror containing a fourth output transistor and an input transistor being said third input transistor, and the predetermined value is dependent on a current supplied by said constant-current source.

3. The detection circuit according to claim 2, further comprising a read-out transistor connected to said second input transistor to form a read-out current mirror having an output outputting an output signal being the evaluation signal.

4. The detection circuit according to claim 3, further comprising a third controllable current source having an output connected to said output of said read-out current mirror.

5. The detection circuit according to claim 4, wherein said third controllable current source has a fifth current mirror with a fifth output transistor and an input transistor being said third input transistor.

6. The detection circuit according to claim 5, wherein said third input transistor, said third output transistor, said fourth output transistor and said fifth output transistor are p-channel MOSFETs.

7. The detection circuit according to claim 1, wherein:
   said first controllable current source contains an operational amplifier, a third output transistor, and a constant-voltage source with an output;
   said third output transistor being a MOS transistor having a gate terminal and a drain-source path with a first terminal and a second terminal, said first terminal is connected to said common first node, said gate terminal connected to said operational amplifier and having a gate potential controlled by said operational amplifier such that a voltage provided by said constant-voltage source is present at said second terminal of said drain-source path of said third output transistor;
   said second controllable current source has a fourth output transistor being a MOS transistor having a drain-source path with a first terminal connected to said common second node and a second terminal, said fourth output transistor further having a gate terminal connected to said gate terminal of said third output transistor; and
   the predetermined value is dependent on the voltage provided by said constant-voltage source.

8. The detection circuit according to claim 7, wherein:
   said operational amplifier has a non-inverting input connected to said output of said constant-voltage source;
   said operational amplifier has an inverting input connected to said second terminal of said drain-source path of said third output transistor; and
   said operational amplifier has an output connected to said gate terminal of said third output transistor.

9. The detection circuit according to claim 7, further comprising a read-out transistor, and said second input transistor is connected to said read-out transistor to form a read-out current mirror having an output outputting an output signal functioning as the evaluation signal.

10. The detection circuit according to claim 9, further comprising a fifth output transistor being a MOS transistor and having a drain-source path with a first terminal connected to said output of said read-out current mirror and a second terminal, said fifth output transistor further having a gate terminal connected to said gate terminal of said fourth output transistor.

11. The detection circuit according to claim 10, further comprising a plurality of resistors including a first resistor, a second resistor and a third resistor each having a first terminal and a second terminal, said second terminal of said drain-source path of said third, fourth and fifth output transistors is connected to said first terminal of said first, second and third resistors respectively, said second terminal of said first, second and third resistors receiving a supply voltage.

12. The detection circuit according to claim 10, wherein said third output transistor, said fourth output transistor and said fifth output transistor are p-channel MOSFETs.

13. The detection circuit according to claim 10, wherein said first input transistor, said second input transistor, said first output transistor, said second output transistor, and said read-out transistor are n-channel MOSFETs.

14. A protection circuit for limiting a signal potential present on a line below a predetermined signal potential value, comprising:
    a converter circuit for converting the signal potential into a corresponding signal current;
    the detection circuit according to claim 1 for ascertaining the presence of the overshooting of the current flowing through the line above the predetermined value, said detection circuit connected to said converter circuit and providing an output signal; and
    a protection device for limiting the signal potential below the predetermined signal potential value in a manner dependent on the output signal of said detection circuit, the current corresponding to the signal current, said protection device connected to said detection device.

15. A protection circuit for limiting a signal current flowing through a line below a predetermined signal current value, comprising:
    the detection circuit according to claim 1 for ascertaining the presence of the overshooting of the current flowing through the line above the predetermined value; and
    a protection device for limiting the signal current below the predetermined signal current value in a manner dependent on an output signal of the detection circuit, the current corresponding to the signal current, said protection device connected to said detection device.

16. The protection circuit according to claim 15, wherein said protection device has a MOS transistor with a drain-source path through which the line leads and a gate terminal, said protection device further having a clamping transistor connected to said gate terminal of said MOS transistor and a gate potential of said MOS transistor being controllable by said clamping transistor, said clamping transistor configured such that, in an event of the overshooting of the predetermined signal current value, said clamping transistor limits the signal current below the predetermined signal current value.

17. The protection circuit according to claim 16, wherein said clamping transistor turns off said MOS transistor.

18. A line driver configuration, comprising:
    a differential line driver;
    four protection circuits connected to said differential line driver, each of said four protection circuits containing:
        the detection circuit according to claim 1 for ascertaining the presence of the overshooting of the current flowing through the line above the predetermined value; and
        a protection device for limiting the signal current below the predetermined signal current value in a manner dependent on an output signal of the detection circuit, the current corresponding to the signal current;
    a differential signal input having a first input terminal and a second input terminal functioning also as a signal input for said differential line driver;
    a differential signal output with a first output terminal and a second output terminal functioning also as a signal output of said differential line driver;
    a load, to which a signal can be communicated, and connected between said first output terminal and said second output terminal;
    a first MOS transistor having a drain-source path through which a first signal line leads and through the first signal line a first signal current flows;
    a second MOS transistor having a drain-source path through which a second signal line leads and through the second signal line a second signal current flows;
    a third MOS transistor having a drain-source path through which a third signal line leads and through the third signal line a third signal current flows; and
    a fourth MOS transistor having a drain-source path through which a fourth signal line leads and through the fourth signal line a fourth signal current flows;
    the first signal current and second signal current feed said first output terminal;
    the third signal current and the fourth signal current feed said second output terminal, and each of the four signal currents being able to be limited by in each case one of said four protection circuits.

19. The line driver configuration according to claim 18, wherein, in an event of overshooting of one of the first, second, third and fourth signal current above the predetermined signal current value, the first, second, third and fourth signal currents are limited by said four protection circuits.

20. The line driver configurations according to claim 18, further comprising a counter configured for counting successive instances of overshooting of the signal currents above the predetermined signal current value, and, in an event of a number of instances of overshooting within a predetermined period of time which exceeds a predetermined number, said counter causes said protection circuits to limit the signal currents.

21. The line driver configuration according to claim 20, wherein said counter is a digital counter.

* * * * *